(12) United States Patent
Rancuret et al.

(10) Patent No.: US 7,952,178 B2
(45) Date of Patent: May 31, 2011

(54) PACKAGE FOR AN INTEGRATED CIRCUIT

(75) Inventors: Paul L. Rancuret, Plano, TX (US);
John T. McKinley, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/945,338

(22) Filed: Nov. 12, 2010

(65) Prior Publication Data
US 2011/0057303 A1 Mar. 10, 2011

Related U.S. Application Data (62) Division of application No. 12/575,583, filed on Oct. 8, 2009, now Pat. No. 7,847,381, which is a division of application No. 11/436,729, filed on May 17, 2006, now Pat. No. 7,612,440.

(60) Provisional application No. 60/682,248, filed on May 18, 2005.

(51) Int. Cl.
*H01L 23/02* (2006.01)

(52) U.S. Cl. .................................. 257/678; 257/680
(58) Field of Classification Search .................. 257/678, 257/680
See application file for complete search history.

(56) References Cited

U.S. PATENT DOCUMENTS

| 5,702,256 | A | 12/1997 | Severn |
| 7,407,826 | B2 | 8/2008 | Jafri et al. |
| 7,612,440 | B2 | 11/2009 | Rancuret et al. |

*Primary Examiner* — Douglas M Menz
(74) *Attorney, Agent, or Firm* — Charles A. Brill; Wade James Brady, III; Frederick J. Telecky, Jr.

(57) ABSTRACT

According to various illustrative embodiments of the present invention, a device for an integrated circuit includes a monolithic frame having a plurality of alignment features disposed thereon, the monolithic frame having a mounting surface disposed thereon for the integrated circuit, the monolithic frame also having a thermal interface area disposed thereon for the integrated circuit. The device also includes an electrical interface capable of providing an electrical connection for the integrated circuit, the plurality of alignment features being substantially independent of the electrical interface, and an adhesive layer disposed between the monolithic frame and the electrical interface.

20 Claims, 9 Drawing Sheets

PACKAGE FOR AN INTEGRATED CIRCUIT

This application is a divisional of application Ser. No. 12/575,583, filed Oct. 8, 2009, which is a divisional of application Ser. No. 11/436,729, filed May 17, 2006, which claims the benefit of provisional Application No. 60/682,248, filed May 18, 2005.

RELATED APPLICATIONS

This application is related to U.S. Provisional Patent Application Ser. No. 60/682,248 entitled "MONOLITHIC FRAME FOR A MEMS SPATIAL LIGHT MODULATOR IC," which was filed on May 18, 2005.

TECHNICAL FIELD OF THE INVENTION

This invention relates generally to the field of integrated circuit packaging and, more specifically, to a monolithic frame device for an integrated circuit (IC).

BACKGROUND OF THE INVENTION

A package for a micro-electro-mechanical system (MEMS) spatial light modulator (SLM) integrated circuit (IC) is required to perform the functions of (1) furnishing an electrical connection between the integrated circuit (IC) and the system using the integrated circuit (IC), where the electrical connection must provide sufficient electrical signal integrity, (2) furnishing a thermal connection between the integrated circuit (IC) and the system using the integrated circuit (IC), where the thermal connection must provide a sufficiently low thermal resistance, and (3) furnishing opto-mechanical alignment between the integrated circuit (IC) and the system using the integrated circuit (IC), where the mechanical alignment features and/or mechanism must provide sufficient alignment tolerance. The combination of the second and third functions stated above suggests that the package must provide sufficient structural integrity to endure the mechanical loads associated with those functions. Additionally, end-products that utilize such micro-electro-mechanical system (MEMS) spatial light modulator (SLM) integrated circuit (IC) devices typically also require that the packaged device consume the smallest possible installed footprint.

Current, conventional state-of-the-art design approaches are, (A) composite construction, and (B) principle-member construction. These two design approaches represent a trade-off between structural integrity and installed footprint size.

Composite construction strives to achieve sufficient structural integrity as a consequence of assembling a number of piece-parts into a final package assembly. In this case, no single piece-part by itself provides adequate structural integrity. Only the combination of the individual piece-parts can hope to achieve sufficient structural integrity. Such a composite construction carrier may have a relatively small package footprint owing to the fact that features (electrical, mechanical, and thermal) may be stacked on top of each other. However, optimization of the overall design of such a composite construction carrier disadvantageously is complicated by the fact that each of the plurality of piece-parts has an effect on the structural integrity of such a composite construction carrier, which, in turn, places additional restrictions on the design and/or composition of each piece-part. For example, the coefficient of thermal expansion (CTE) of each piece-part must be matched, since mis-matches in the coefficient of thermal expansion (CTE) have the potential of negatively impacting the structural integrity of the overall design.

Principle-member construction strives to achieve sufficient structural integrity as a consequence of providing a single piece-part of the overall package to impart substantially all of the structural integrity. Such a principle-member construction carrier may have alignment tolerances minimized because most, if not all, of the tolerances are contained in a single piece-part. However, such a principle-member construction carrier disadvantageously has a much larger package footprint owing to the fact that features, principally electrical and mechanical, are located in essentially the same plane and must be spread out to eliminate physical interference.

SUMMARY OF THE INVENTION

According to various illustrative embodiments of the present invention, a device for an integrated circuit (IC) comprises a monolithic frame having a plurality of alignment features disposed thereon, the monolithic frame having a mounting surface disposed thereon for the integrated circuit (IC), the monolithic frame also having a thermal interface area disposed thereon for the integrated circuit (IC). The device also comprises an electrical interface capable of providing an electrical connection for the integrated circuit (IC), the plurality of alignment features being substantially independent of the electrical interface, and an adhesive layer disposed between the monolithic frame and the electrical interface.

Some embodiments of the present invention provide numerous technical advantages. Other embodiments may realize some, none, or all of these advantages. For example, various illustrative embodiments may provide a carrier for an integrated circuit (IC), such as a micro-electro-mechanical system (MEMS) spatial light modulator (SLM) integrated circuit (IC), that serves mechanically, electrically, and thermally to interface a packaged integrated circuit (IC), such as a digital micromirror device (DMD), to the opto-mechanical, electrical, and thermal sub-systems of an end product, achieving a relatively small package footprint. Various illustrative embodiments may provide a carrier for an integrated circuit (IC), such as a micro-electro-mechanical system (MEMS) spatial light modulator (SLM) integrated circuit (IC), that has a small package footprint owing to the fact that the features (electrical, mechanical, and thermal) may be stacked on top of each other. Various illustrative embodiments may achieve an installed footprint similar to a composite construction design, but with the structural integrity of a principle member design while still providing a high degree of design flexibility.

Similarly, various illustrative embodiments may provide a carrier for an integrated circuit (IC), such as a micro-electro-mechanical system (MEMS) spatial light modulator (SLM) integrated circuit (IC), that has minimized alignment tolerances because most (if not all) the tolerances are contained on a single piece-part such as a monolithic frame. Likewise, various illustrative embodiments may provide a carrier for an integrated circuit (IC), such as a micro-electro-mechanical system (MEMS) spatial light modulator (SLM) integrated circuit (IC), that has an independence of the electrical interface method.

Furthermore, various illustrative embodiments may provide a carrier for an integrated circuit (IC), such as a micro-electro-mechanical system (MEMS) spatial light modulator (SLM) integrated circuit (IC), that has the potential for front-side cooling.

Other technical advantages will be readily apparent to one of ordinary skill in the art having the benefit of the present disclosure, including the following figures, descriptions, and claims.

BRIEF DESCRIPTION OF THE DRAWINGS

The following figures form part of the present specification and are included to further demonstrate certain aspects of the present invention, and should not be used to limit or define the present invention. The present invention may be better understood by reference to one or more of these drawings in combination with the description of embodiments presented herein. Consequently, a more complete understanding of the present invention and further features and advantages thereof may be acquired by referring to the following description taken in conjunction with the accompanying drawings, in which the leftmost significant digit(s) in the reference numerals denote(s) the first figure in which the respective reference numerals appear, wherein.

It is to be noted, however, that the appended drawings illustrate only typical embodiments of the present invention and are, therefore, not to be considered limiting of the scope of the present invention, as the present invention may admit to other equally effective embodiments.

DETAILED DESCRIPTION OF EXEMPLARY EMBODIMENTS OF THE INVENTION

Illustrative embodiments of the present invention are described in detail below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of the present disclosure.

Figure 1:
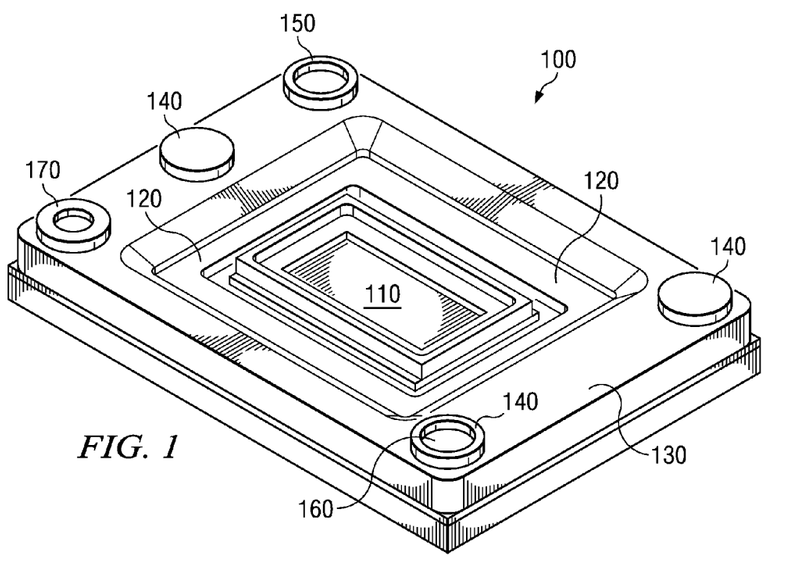
FIG. 1 schematically illustrates a top perspective view of a composite construction carrier having a wafer level package (WLP) digital micromirror device (DMD) chip bonded thereon.
Figure 2:
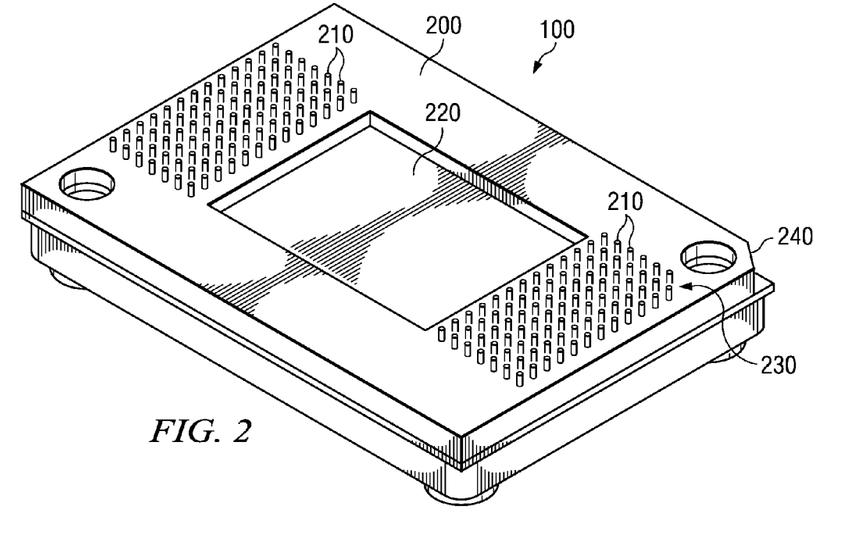
FIG. 2 schematically illustrates a bottom perspective view of the composite construction carrier shown in FIG. 1.
Figure 3:
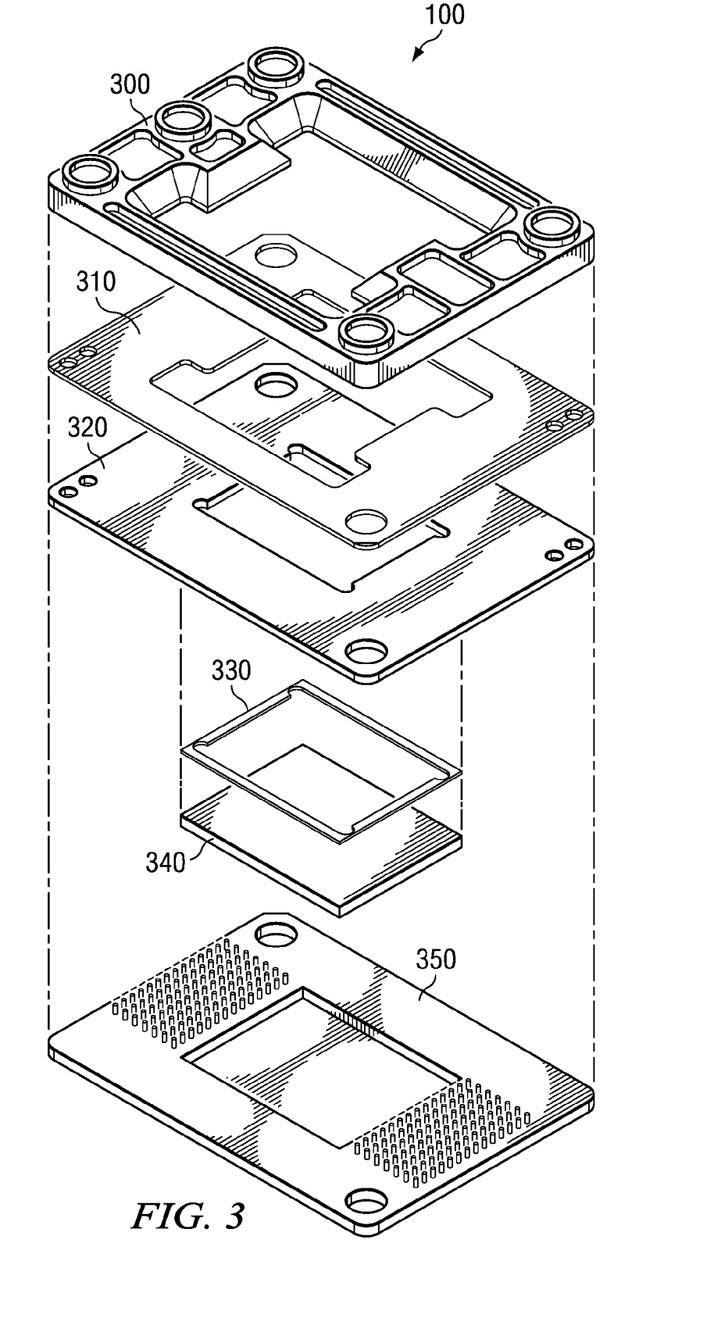
FIG. 3 schematically illustrates an exploded perspective view of the composite construction carrier shown in FIGS. 1 and 2.

The present inventors have recognized several problems with respect to both composite construction carriers and principle-member construction carriers. As described above, composite construction strives to achieve sufficient structural integrity as a consequence of assembling a number of piece-parts into a final package assembly. In this case, no single piece-part by itself provides adequate structural integrity. Only the combination of the individual piece-parts can hope to achieve sufficient structural integrity. For example, as shown in FIGS. 1-3, a composite construction carrier 100 may have a wafer level package (WLP) digital micromirror device (DMD) chip 110 wire-bonded on two sides and attached to bond pad area 120. A top surface 130 may provide a flat area for a system aperture and/or gasket all around (not shown). The composite construction carrier 100 may also have primary datum ('A') areas 140, a secondary datum ('B') hole 150, and a tertiary datum ('C') hole 160 disposed on the top surface 130. The composite construction carrier 100 may also have a keying alignment hole 170.

As shown in FIG. 2, a bottom surface 200 of the composite construction carrier 100 may have a plurality of pins 210 disposed thereon for electrical connection. A thermal interface area 220 may be provided. One of the pins 210 may be missing, as indicated at 230, and a corner chamfer 240 may be provided for alignment orientation and alignment keying. As shown in FIG. 3, the composite construction carrier 100 may have a plastic or metal frame 300, a frame adhesive layer 310 gluing the plastic or metal frame 300 to the top side of a carrier printed circuit board (PCB) 320, a heat slug adhesive 330 gluing the top side of a heat slug 340 to the bottom side of the carrier printed circuit board (PCB) 320, and a pin field assembly 350 glued and/or soldered to the bottom side of a carrier printed circuit board (PCB) 320.

The composite construction carrier 100 may have a relatively small package footprint owing to the fact that features (electrical, mechanical, and thermal) are stacked on top of each other. However, optimization of the overall design of the composite construction carrier 100 disadvantageously is complicated by the fact that each piece-part, the plastic or metal frame 300, the frame adhesive layer 310, the carrier printed circuit board (PCB) 320, the heat slug adhesive 330, the heat slug 340, and the pin field assembly 350, has an effect on the structural integrity of the composite construction carrier 100, which, in turn, places additional restrictions on the design and/or composition of each piece-part. For example, the coefficient of thermal expansion (CTE) of each piece-part must be painstakingly matched, since mis-matches in the coefficient of thermal expansion (CTE) have the potential of negatively impacting the structural integrity of the overall design.

Furthermore, the composite construction carrier 100 does not have independence with regard to the electrical interface method. For the composite construction carrier 100, the thickness of the package carrier printed circuit board (PCB) 320 is not arbitrary. The minimum thickness of the package carrier printed circuit board (PCB) 320 is constrained by the required structural integrity of the resulting composite construction carrier 100. The maximum thickness of the package carrier printed circuit board (PCB) 320 is constrained by the relative height of the die bond pads and the package carrier printed circuit board (PCB) 320 bond fingers. This restriction on the thickness of the package carrier printed circuit board (PCB) 320 results in restriction of the number of layers in the system printed circuit board (PCB) (not shown) and/or the characteristic impedance of the system printed circuit board (PCB).

Figure 4:
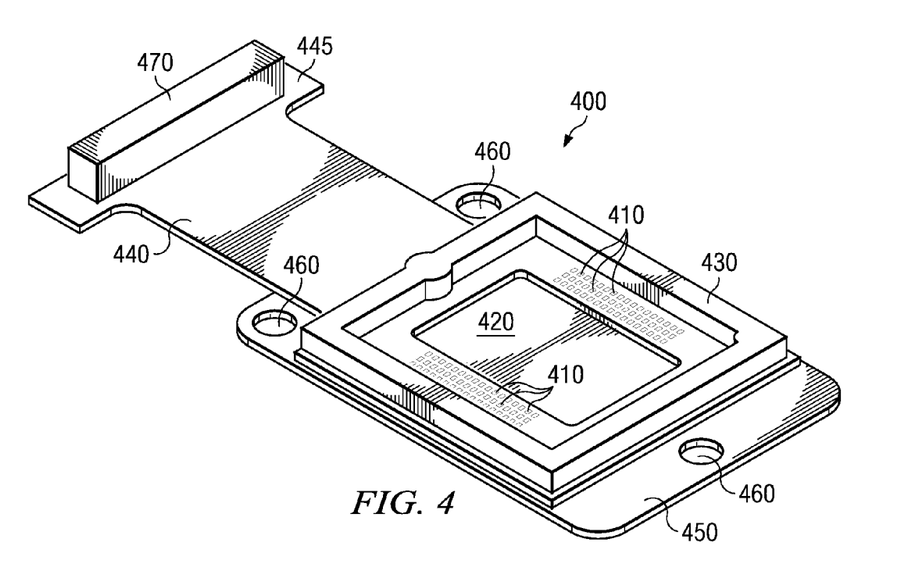
FIG. 4 schematically illustrates a top perspective view of a principle-member construction carrier.
Figure 5:
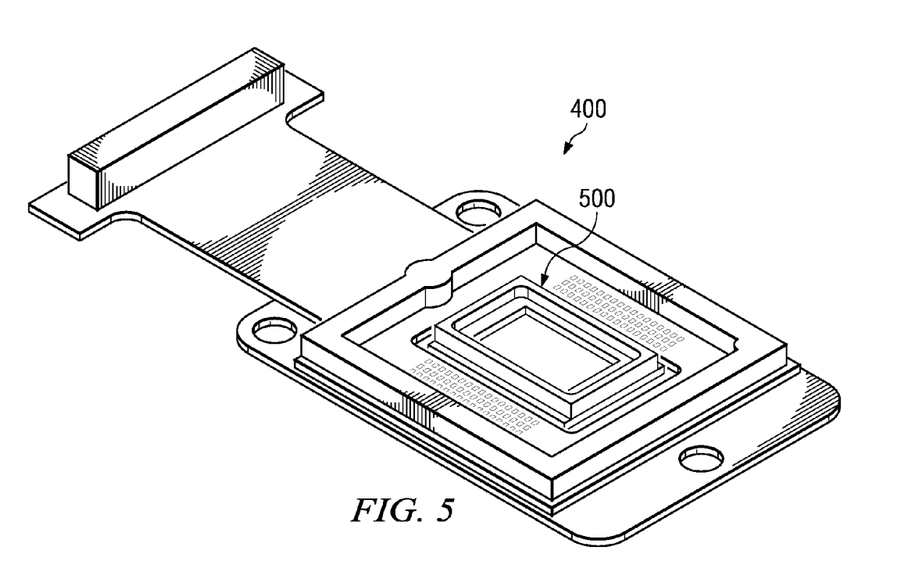
FIG. 5 schematically illustrates a top perspective view of the principle-member construction carrier shown in FIG. 4 having a wafer level package (WLP) digital micromirror device (DMD) chip bonded thereon.

Similarly, as described above, principle-member construction strives to achieve sufficient structural integrity as a consequence of providing a single piece-part of the overall package to impart substantially all of the structural integrity. For example, as shown in FIGS. 4 and 5, a principle-member construction carrier 400 may have a wafer level package (WLP) digital micromirror device (DMD) chip 500 wire-bonded on two sides with bond pads 410 and attached to die mounting surface 420. A frame 430 may be disposed on a flex circuit 440 disposed on a metal plate 450. The metal plate 450 may have three precision system mounting features 460 (holes and surfaces) disposed therein, externally of the flex circuit 440. A portion 445 of the flex circuit 440 separated from the metal plate 450, but in essentially the same plane, may have a high-density connector 470 disposed thereon, the high-density connector 470 having about 203 contacts therein.

The principle-member construction carrier 400 may have alignment tolerances minimized because most, if not all, of the tolerances are contained in a single piece-part, the metal plate 450. However, the principle-member construction carrier 400 disadvantageously has a much larger package footprint owing to the fact that features, principally electrical and mechanical, are located in essentially the same plane and must be spread out to eliminate physical interference. For example, the metal plate 450 needs to have the three precision system precision mounting features 460 disposed externally of the flex circuit 440 in order to clear the flex circuit 440.

The three precision system mounting features 460 are not independent of the flex circuit 440. The metal plate 450 must, therefore, be larger in certain dimensions than certain portions of the flex circuit 440. Moreover, the portion 445 of the flex circuit 440 having the high-density connector 470 disposed thereon must be laterally separated from the metal plate 450 in order for the flex circuit 440 to be able to flex.

Furthermore, the principle-member construction carrier 400 does not have independence with regard to the electrical interface method. For the principle-member construction carrier 400, only the flex circuit 440 interconnect solution is available by design. As described above, the three system precision mounting features 460 are not independent of the flex circuit 440. Moreover, the principle-member construction carrier 400 does not enhance the potential for front-side cooling, since the heat sink is on the bottom of the metal plate 450, insulated from the front side of the principle-member construction carrier 400.

In various illustrative embodiments, as shown, for example, in FIGS. 6-13, a device 600 for an integrated circuit (IC), such as a micro-electro-mechanical system (MEMS) spatial light modulator (SLM) integrated circuit (IC), may have a wafer level package (WLP) digital micromirror device (DMD) chip 610 bonded thereon. One of ordinary skill in the art having the benefit of the present disclosure would appreciate that the device 600 could usefully be used with any suitable integrated circuit (IC), and the micro-electro-mechanical system (MEMS) spatial light modulator (SLM) integrated circuit (IC) described more particularly herein is but one of many suitable types of integrated circuits (ICs) with which the device 600 may usefully be used.

Figure 6A:
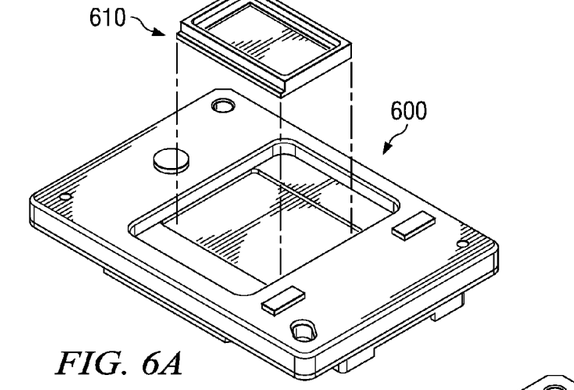
FIG. 6 schematically illustrates an exemplary embodiment of a device for an integrated circuit (IC), such as a microelectro-mechanical system (MEMS) spatial light modulator (SLM) integrated circuit (IC), according to the present invention, the device shown having a wafer level package (WLP) digital micromirror device (DMD) chip bonded thereon.
Figure 6B:
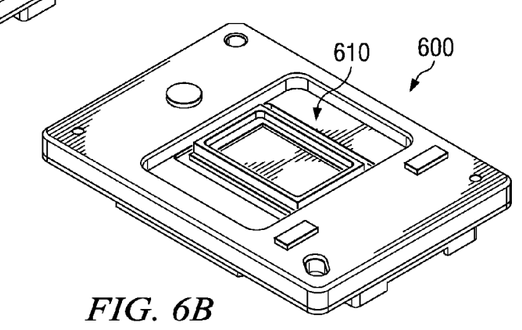
Figure 7:
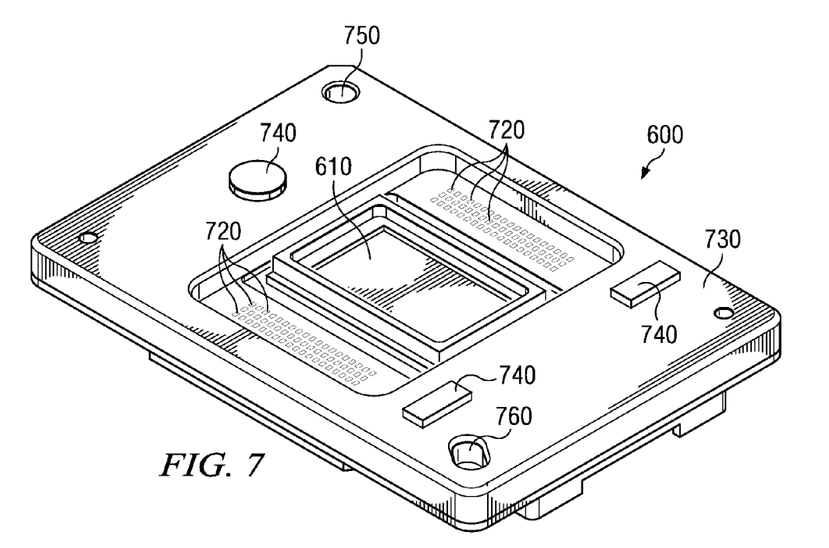
FIG. 7 schematically illustrates a top perspective view of the device shown in FIG. 6.

FIG. 6B shows the device 600 after the a wafer level package (WLP) digital micromirror device (DMD) chip 610 has been die attached and wire bonded thereto, and before encapsulation, for the sake of clarity of description. In various illustrative embodiments, as shown in FIG. 7, the device 600 may have the wafer level package (WLP) digital micromirror device (DMD) chip 610 wire-bonded on two sides to bond pad area 720. A top surface 730 may provide a flat area for a system aperture and gasket all around (not shown). The device 600 may also have one or more primary datum ('A') alignment features 740 (three are shown in FIG. 7), one or more secondary datum ('B') alignment features 750, and one or more tertiary datum ('C') alignment features 760 disposed on the top surface 730. The primary datum ('A') features may be of different shapes (as shown), but may be designed to cover the same surface area (as shown) in order to equalize the mechanical load distribution. The surface 730 may be provided as a thermal interface in addition to the thermal interface provided by area 820.

In various illustrative embodiments, the one or more secondary datum ('B') alignment features 750, and/or the one or more tertiary datum ('C') alignment features 760 may be used for opto-mechanical alignment and/or keying. In various illustrative embodiments the one or more secondary datum ('B') alignment features 750, and/or the one or more tertiary datum ('C') alignment features 760 may be implemented as (1) two holes, each of substantially the same diameter, (2) two holes, each of different diameters, to facilitate keying, (3) a hole and a slot, both of substantially the same basic diameter/width, (4) a hole and a slot, each of different diameter/width, to facilitate keying, (5) two pins, each of substantially the same diameter, (6) two pins, each of different diameters, to facilitate keying, (7) two pins, one longer than the other, to aid engagement, (8) a pin and an oblong pin, of substantially the same diameter/width, (9) a pin and an oblong pin, each of different diameter/width, to facilitate keying, (10) a pin and a hole, each of substantially the same diameter, (11) a pin and a hole, each of different diameters, to facilitate keying, (12) a pin and a slot, of substantially the same diameter/width, (13) a pin and a slot, each of different diameter/width, to facilitate keying, (14) an oblong pin and a hole, each of substantially the same diameter/width, (15) an oblong pin and a hole, each of different diameter/width, to facilitate keying, (16) two edges, which could be one of the long outside edges and one of the short outside edges of the top surface 730, or one or both of the "edges" could be protruding and/or recessed structures formed on the top surface 730, and (17) notches along external and/or internal edges on the top surface 730, for example. In various illustrative embodiments, one or more of the pins used could protrude from the top surface 730 and/or be recessed in a respective well disposed in the top surface 730.

Figure 8:
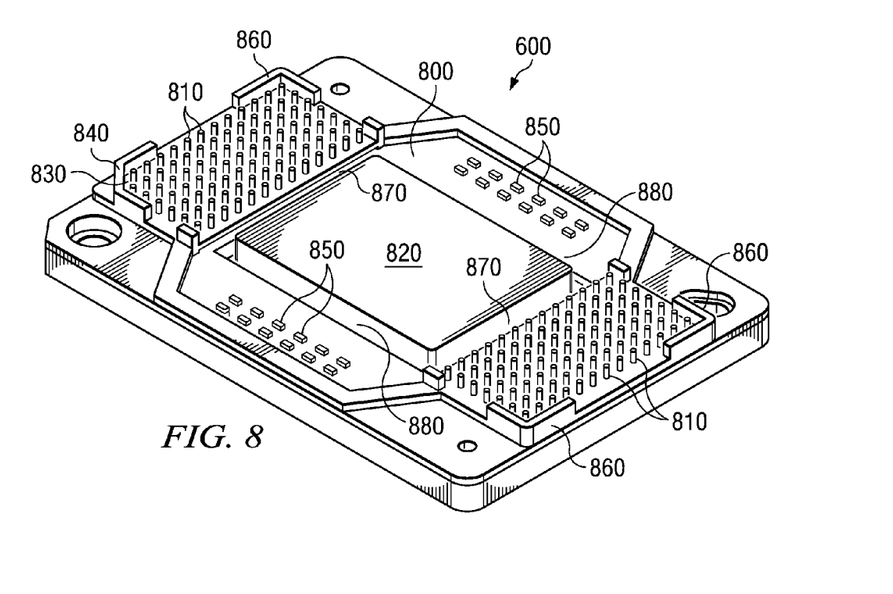
FIG. 8 schematically illustrates a bottom perspective view of the device shown in FIG. 6.

As shown in FIG. 8, a bottom surface 800 of the device 600 may have a plurality of electrical contact pins 810 disposed thereon for electrical connection. The number of the electrical contact pins 810 provided should be suitable to the number required for the operation of, and the electrical interfacing with, the wafer level package (WLP) digital micromirror device (DMD) chip 610. For example, in various illustrative embodiments, about 223 electrical contact pins 810 may be provided. A thermal interface area 820 may be provided in addition to the thermal interface area provided by the top surface 730. One of the electrical contact pins 810 (for example, the A1 pin) may be missing, as indicated at 830, and a corner chamfer 840 may be provided, for alignment orientation and alignment keying. The bottom surface 800 of the device 600 may have a plurality of capacitors 850 disposed thereon. The number of the decoupling capacitors 850 provided should be suitable to the number required for the operation of, and the electrical interfacing with, the wafer level package (WLP) digital micromirror device (DMD) chip 610. For example, in various illustrative embodiments, about 24 capacitors 850 may be provided between the various electrical power nodes and electrical ground nodes. The bottom surface 800 of the device 600 may have a plurality of pin-guard and alignment features 860 disposed thereon.

Figure 9:
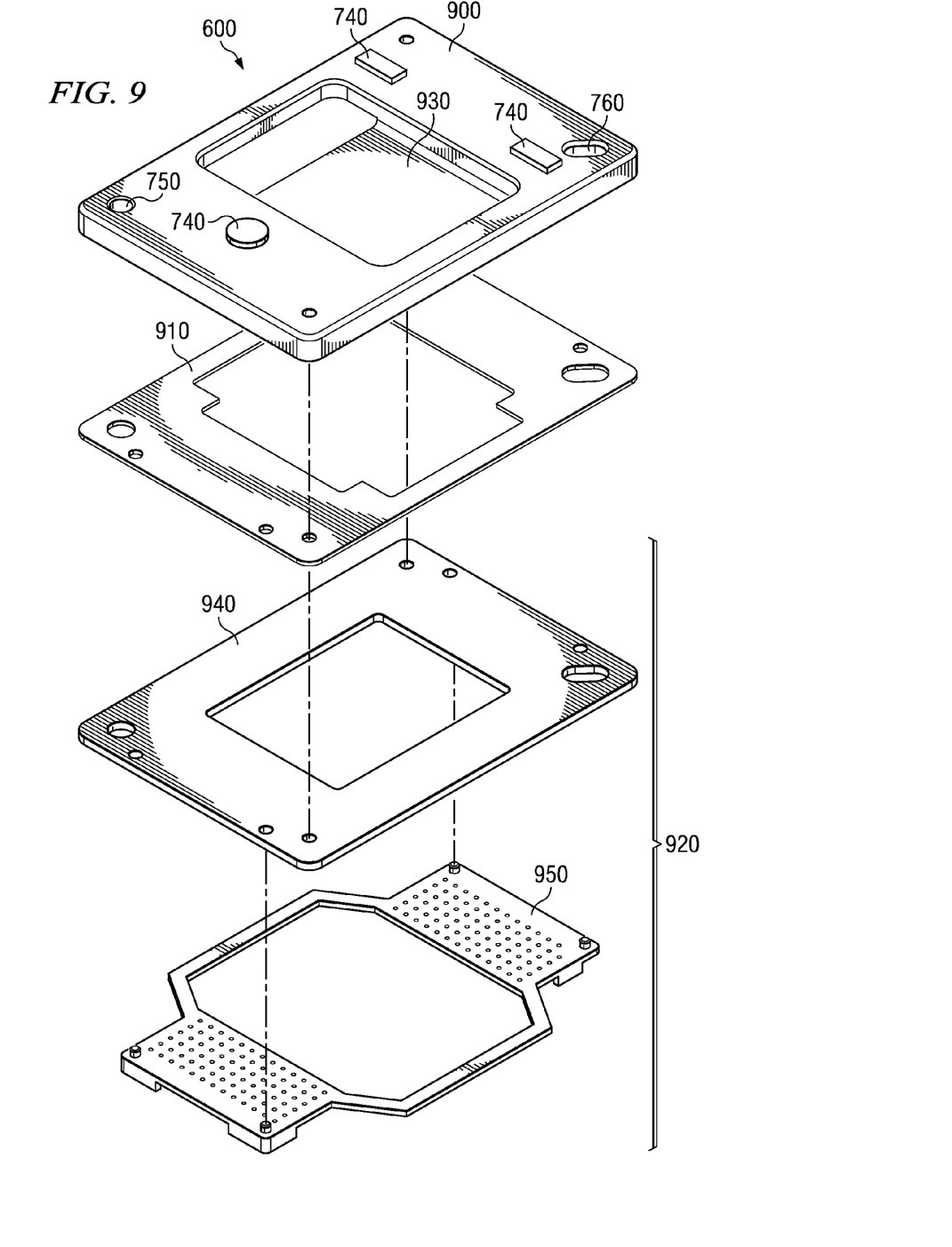
FIG. 9 schematically illustrates an exploded perspective view of various illustrative embodiments of the device shown in FIG. 6.

As shown in FIG. 9, the device 600 may comprise a monolithic frame 900, an adhesive layer 910, and an electrical interface 920 capable of providing an electrical connection for a spatial light modulator (SLM) integrated circuit (IC), such as the wafer level package (WLP) digital micromirror device (DMD) chip 610, for example. The monolithic frame 900 may have the plurality of alignment features 740, 750, and 760 disposed thereon. The monolithic frame 900 may also have at least one keying feature 750 and/or 760 disposed thereon, as described above. The monolithic frame 900 may have a mounting surface 930 disposed thereon for the integrated circuit (IC), such as the spatial light modulator (SLM) integrated circuit (IC), such as the wafer level package (WLP) digital micromirror device (DMD) chip 610, for example.

The monolithic frame 900 may also have the thermal interface area 820 (as shown, for example, in FIG. 8), in addition to the thermal interface area provided by the top surface 730, disposed thereon for the integrated circuit (IC), such as the spatial light modulator (SLM) integrated circuit (IC), such as the wafer level package (WLP) digital micromirror device (DMD) chip 610, for example. In various illustrative embodiments, in addition to the thermal interface area 820, the top surface 730 disposed on the monolithic frame 900 may be capable of providing front-side cooling for the device 600, in particular, since the thermal interface area 820 in addition to the thermal interface area provided by the top surface 730 may be integral with, and not thermally insulated from, the monolithic frame 900.

In various illustrative embodiments, the monolithic frame 900 may further comprise a suitable material having a suitable coefficient of thermal expansion (CTE) and/or a suitable thermal conductivity and/or a suitable modulus of elasticity. For example, in various illustrative embodiments, the monolithic frame 900 may further comprise unplated powdered metal Kovar having a coefficient of thermal expansion (CTE) substantially matched to silicon (Si). In various alternative illustrative embodiments, for example, the monolithic frame 900 may further comprise at least one of alloy-42, aluminum silicon carbide, and/or ceramic, and the like, having a coefficient of thermal expansion substantially matched to silicon (Si).

In various illustrative embodiments, the monolithic frame 900 may be electrically connected to a ground, such as a signal ground (digital or analog), and/or a chassis ground, and the like.

Figure 10:
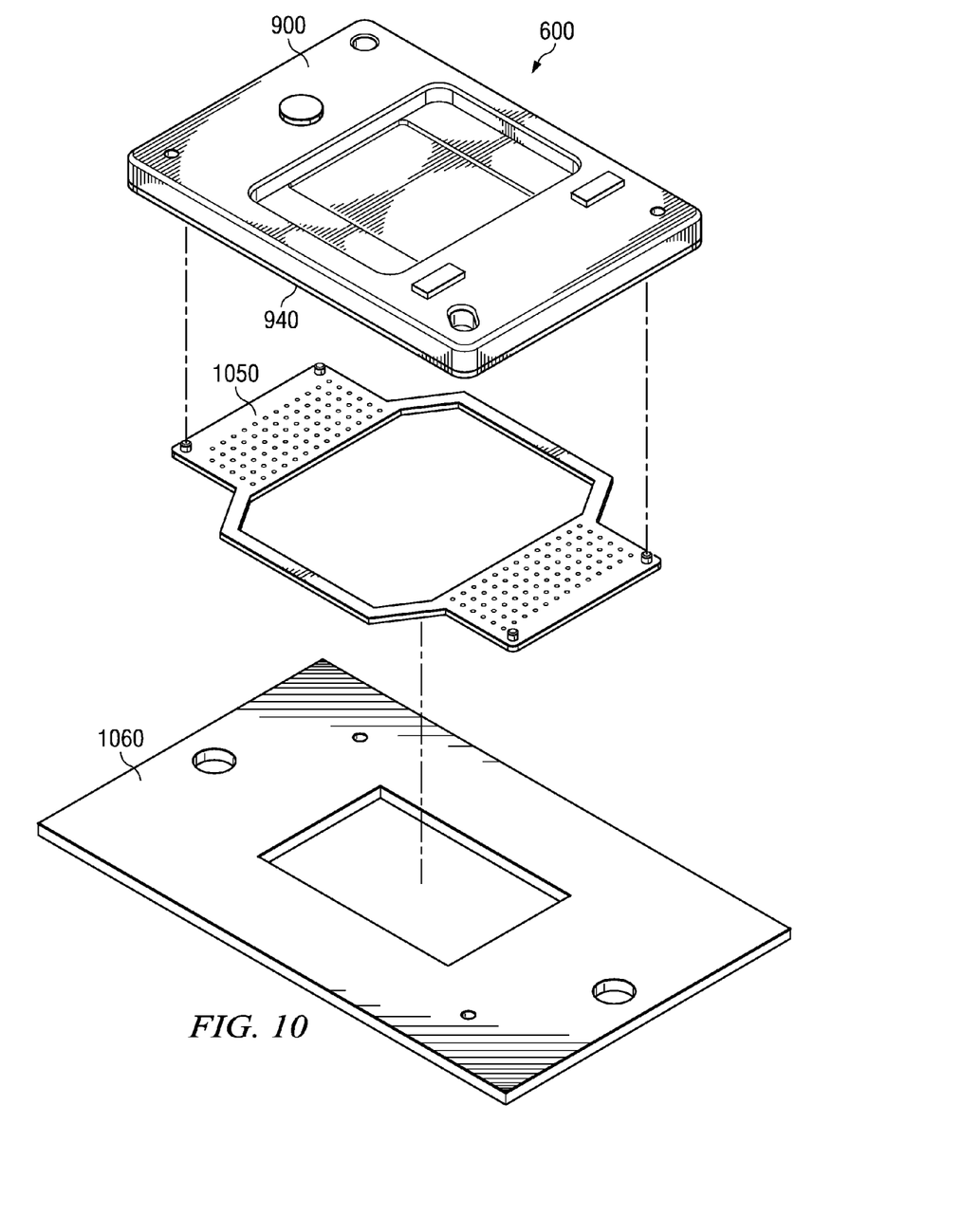
FIG. 10 schematically illustrates an exploded perspective view of various alternative illustrative embodiments of the device shown in FIG. 6.

In various illustrative embodiments, as shown in FIG. 9, the electrical interface 920 may comprise a printed circuit board (PCB) 940 and a pin field sub-assembly 950, with the printed circuit board (PCB) 940 disposed between the adhesive layer 910 and the pin field sub-assembly 950. In various alternative illustrative embodiments, as shown in FIG. 10, the electrical interface 920 may comprise a printed circuit board (PCB) 940 and a mechanical compression interface 1050, with the printed circuit board (PCB) 940 disposed between the adhesive layer 910 (not shown in FIG. 10) and the mechanical compression interface 1050. The printed circuit board (PCB) 940 may have land grid array (LGA) pads (not shown) disposed thereon that work cooperatively with the mechanical compression interface 1050 to establish electrical contact with a system printed circuit board (PCB) 1060 that may also have land grid array (LGA) pads (not shown) disposed thereon. In such embodiments, the mechanical compression interface 1050, as shown in FIG. 10, may be used instead of the pin field sub-assembly 950, as shown in FIG. 9, for example.

Figure 11:
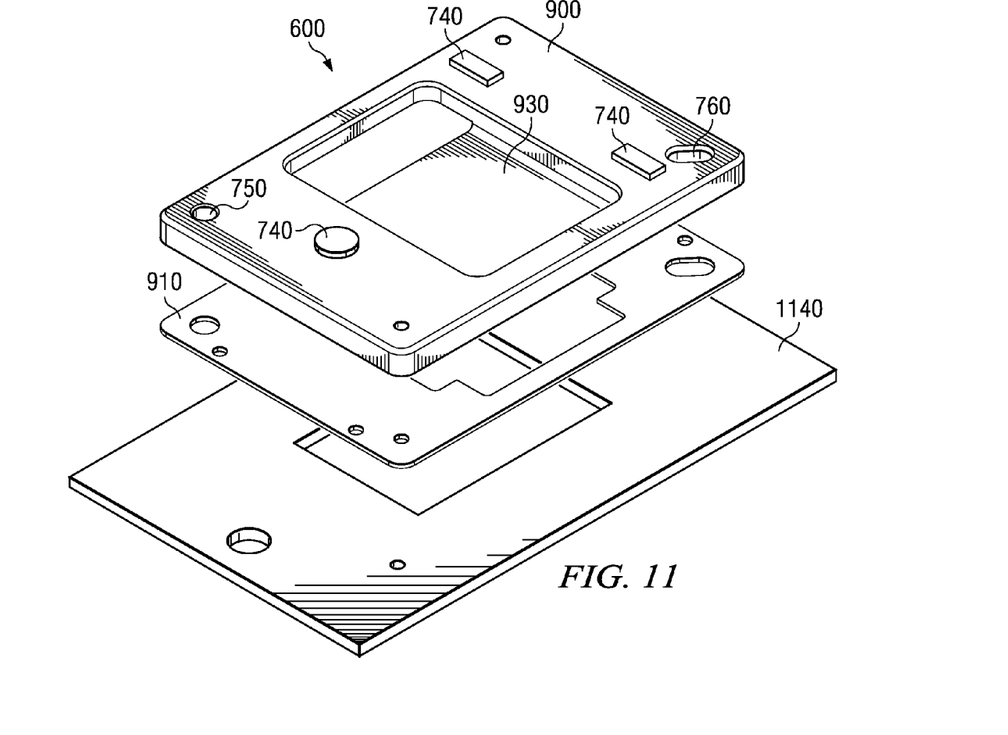
FIG. 11 schematically illustrates an exploded perspective view of various other alternative illustrative embodiments of the device shown in FIG. 6.

In various other alternative illustrative embodiments, as shown in FIG. 11, the electrical interface 920 may comprise a system printed circuit board (PCB) 1140, with the adhesive layer 910 disposed between the monolithic frame 900 and the system printed circuit board 1140. The system printed circuit board 1140 may be similar to the system printed circuit board 1060, as shown in FIG. 10, for example. In another embodiment, the functions provided by the printed circuit board 1140 may be a hybrid of the functions provided by the printed circuit board 940 and printed circuit board 1060, as shown in FIG. 10, for example. In such embodiments, the pin field sub-assembly 950, as shown in FIG. 9, and/or the mechanical compression interface 1050, as shown in FIG. 10, may not need to be used since the monolithic frame 900, and, hence, the integrated circuit (IC), such as the spatial light modulator (SLM) integrated circuit (IC), such as the wafer level package (WLP) digital micromirror device (DMD) chip 610, for example, mounted thereon, may be directly electrically connected with the system printed circuit board 1140.

Figure 12:
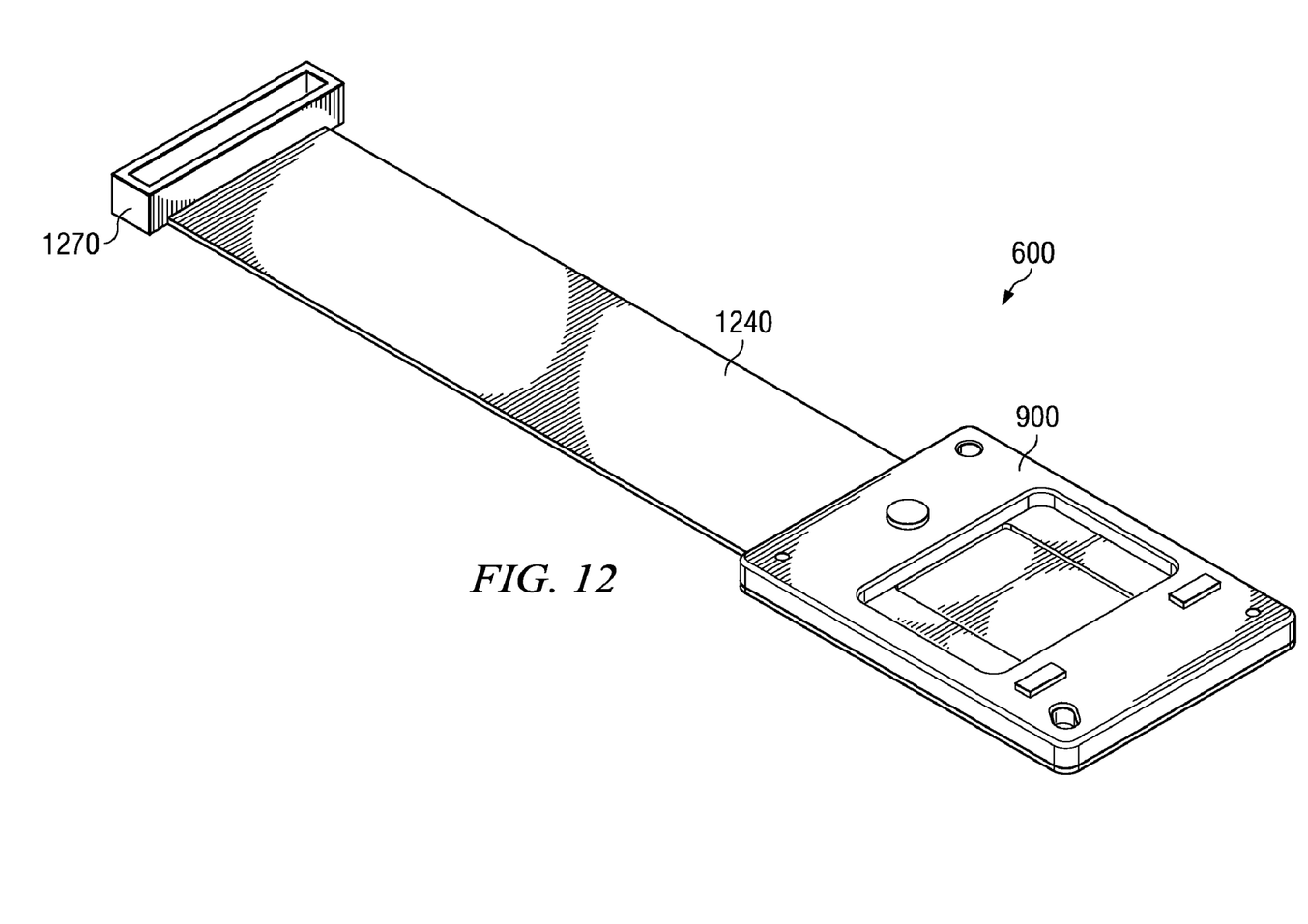
FIG. 12 schematically illustrates a perspective view of various other alternative illustrative embodiments of the device shown in FIG. 6.

In various other alternative illustrative embodiments, as shown in FIG. 12, the electrical interface 920 may comprise a flex circuit 1240, with the adhesive layer 910 disposed between the monolithic frame 900 and the flex circuit 1240. The flex circuit 1240 may be connected to a high-density connector 1270 disposed thereon.

In various illustrative embodiments, the monolithic frame 900 may support the creation of a wirebond interface (not shown) between the integrated circuit (IC), such as the spatial light modulator (SLM) integrated circuit (IC), such as the wafer level package (WLP) digital micromirror device (DMD) chip 610, for example, and the printed circuit board (PCB) 940, the system printed circuit board 1140, and/or the flex circuit 1240. In various alternative illustrative embodiments, the monolithic frame 900 may support the creation of an anisotropic film interface (not shown) between the integrated circuit (IC), such as the spatial light modulator (SLM) integrated circuit (IC), such as the wafer level package (WLP) digital micromirror device (DMD) chip 610, for example, and the printed circuit board (PCB) 940, the system printed circuit board 1140, and/or the flex circuit 1240.

In various illustrative embodiments, the adhesive layer 910 may comprise a non-conductive adhesive having an optimized thickness, which may be about 0.001 inch. In various illustrative embodiments, the adhesive layer 910 may have an optimized thickness and/or an optimized modulus and/or an optimized coefficient of thermal expansion (CTE) between the monolithic frame 900 and the electrical interface 920. For example, a Henkel/Loctite EO1016 non-conductive adhesive may be used. In various illustrative embodiments, the adhesive layer 910 may comprise a conductive adhesive between the monolithic frame 900 and a ground (analog, digital, chassis, or otherwise) of the electrical interface 920, as indicated at 870 and/or 880 in FIG. 8. For example, a Henkel/Loctite 3880 conductive adhesive may be used. In various illustrative embodiments, the adhesive layer 910 may comprise a combination of conductive and non-conductive adhesives between the monolithic frame 900 and the electrical interface 920. In various illustrative embodiments, the adhesive layer 910 may comprise an adhesive filled with uniformly sized particles, 0.050 mm over the surface for example, used to control the final adhesive layer thickness of the device.

In various illustrative embodiments, the adhesive layer 910 may comprise a non-conductive, high-viscosity adhesive gap filler between the monolithic frame 900 and the electrical interface 920, as indicated at 870 and/or 880 in FIG. 8. For example, a Henkel/Loctite FP6401 non-conductive, high-viscosity adhesive may be used. In various alternative illustrative embodiments, the adhesive layer 910 may comprise a conductive adhesive gap filler between the monolithic frame 900 and the electrical interface 920, as indicated at 870 and/or 880 in FIG. 8. For example, a Henkle/Loctite 3880 conductive adhesive may be used. In various other alternative illustrative embodiments, the adhesive layer 910 may comprise a combination of conductive and non-conductive adhesive gap filler between the monolithic frame 900 and the electrical interface 920, as indicated at 870 and/or 880 in FIG. 8. In various illustrative embodiments, the printed circuit board (PCB) 940 may comprise a 6-layer FR-4 dielectric, for example, and may have a controlled impedance of about 50 ohms single-ended with an about 100 ohms differential. In various illustrative embodiments, the printed circuit board (PCB) 940 may have a layout geometry with an about 4 mil trace and an about 4 mil space, with about 8 mil vias. In various illustrative embodiments, the printed circuit board (PCB) 940 may have about 24 discrete capacitors 850, as described above and as shown in FIG. 8, for example. In various illustrative embodiments, the capacitors 850 may be size 0402, for example, with suitable sizes being chosen for given applications, as would be known by those of ordinary skill in the art having the benefit of the present disclosure. In various illustrative embodiments, the printed circuit board (PCB) 940 may have wire-bondable gold on the bond fingers. For example, MIL-G-45204, Type 3, Grade A may be suitable for use. In various illustrative embodiments, routing and drilling tolerances of the printed circuit board (PCB) 940 may be important.

In various illustrative embodiments, the pin field sub-assembly 950 may have pin-guard features, and/or socket alignment features, and/or socket orientation keying features, such as the plurality of pin-guard and alignment features 860 and the orientation key corner chamfer 840, as described above and as shown in FIG. 8, which may, for example, be useful for the original equipment manufacturer (OEM) during alignment and testing operations. In various illustrative embodiments, the pin-guard, and/or socket alignment, and/or socket orientation key functional features may be incorporated into one or more physical features, such as the plurality of pin-guard and alignment features 860, which may also include orientation key corner chamfer 840. In various illustrative embodiments, the pin field sub-assembly 950 may have pins having diameters of about 0.305 mm, lengths of about 1.4 mm, and spacings of about 1.27 mm between pins. In various illustrative embodiments, the pin field sub-assembly 950 may have socket keying features. In various illustrative embodiments, the pin field sub-assembly 950 may have a pin-to-pin position tolerance of about 0.25 mm, and a pin-to-pin-guard position tolerance of about 0.36 mm. In various illustrative embodiments, the pin field sub-assembly 950 may have nickel and gold plated pins.

The device 600 may have a relatively small package footprint owing to the fact that features (electrical, mechanical, and thermal) are stacked on top of each other. Moreover, optimization of the overall design of the device 600 advantageously is uncomplicated, in part, because sufficient structural integrity is achieved as a consequence of providing a single piece-part of the overall device 600, the monolithic frame 900, to impart substantially all of the structural integrity. Furthermore, the device 600 may have alignment tolerances minimized because most, if not all, of the alignment tolerances are contained in a single piece-part, the monolithic frame 900. The device 600 may achieve an installed footprint similar to a composite construction design, but with the structural integrity of a principle member design while still providing a high degree of design flexibility, for example.

Advantageously, the device 600 may have independence with regard to the electrical interface method. For example, for the device 600, the thickness of the printed circuit board (PCB) 940 is substantially arbitrary since accommodation for different printed circuit board (PCB) 940 thicknesses can be designed into the monolithic frame 900. The minimum thickness of the printed circuit board (PCB) 940 is not constrained by the required structural integrity of the resulting device 600, since the monolithic frame 900 may impart substantially all of the required structural integrity. In various illustrative embodiments, the plurality of alignment features 740, 750, and/or 760 may be substantially independent of the electrical interface 920. As described above, the electrical interface 920 may at least comprise (1) the printed circuit board (PCB) 940 and the pin field sub-assembly 950, as shown in FIG. 9, (2) the printed circuit board (PCB) 940 and the mechanical compression interface 1050, as shown in FIG. 10, (3) the system printed circuit board 1140 directly, as shown in FIG. 11, which arrangement achieves a particularly high level of system integration, or (4) the flex circuit 1240, as shown in FIG. 12, for example.

Additionally, the device 600 may enhance the potential for front-side cooling. As described above, the top surface 730 and the thermal interface area 820 are disposed on the monolithic frame 900 as an integral part of, and not thermally isolated from, the monolithic frame 900, so that the arrangement may enhance the potential for cooling through the top surface 730 as well as through the traditional thermal interface 820.

Figure 13:
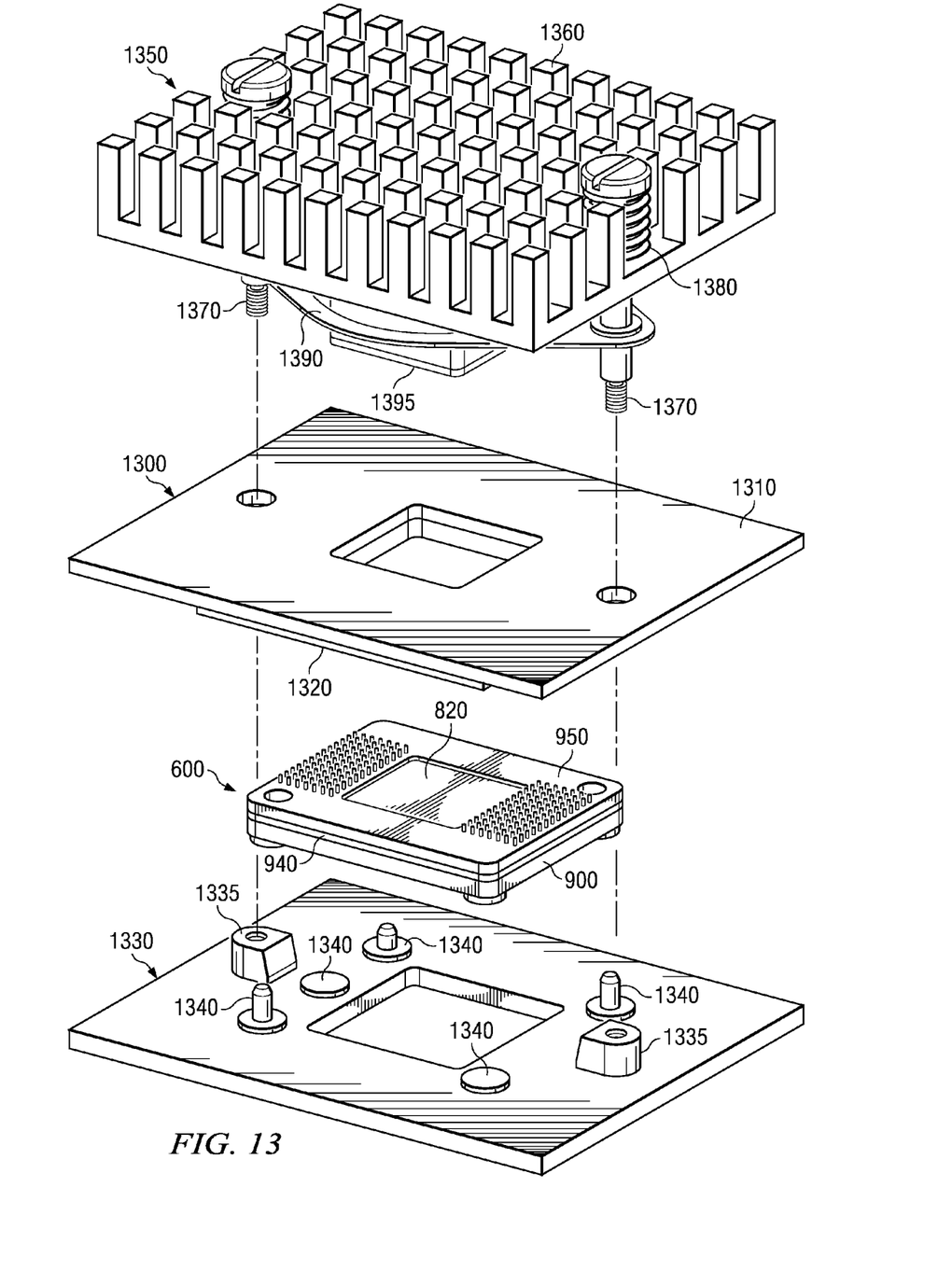
FIG. 13 schematically illustrates an exploded perspective view of various illustrative embodiments of a system using the device shown in FIG. 6 therein.

In various illustrative embodiments, as shown in FIG. 13, the device 600 may be disposed between a system printed circuit board (PCB) assembly 1300, having a system printed circuit board 1310 similar to the system printed circuit board (s) (PCB) 1060 and/or 1140 described above, and a socket assembly 1320 thereon, and a mechanical system interface 1330, having a plurality of alignment and/or keying features 1340 disposed thereon. A heat sink assembly 1350 may be disposed on the side of the system printed circuit board (PCB) assembly 1300 opposite to the device 600. The heat sink assembly 1350 may have a heat sink 1360, screws 1370, coil springs 1380, one or more leaf springs 1390, and a thermal pad 1395 disposed thereon. The screws 1370 may be received by threaded features 1335 disposed on the system interface 1330 to attach the heat sink assembly 1350, through the system printed circuit board (PCB) assembly 1300, to the system interface 1330, sandwiching the device 600, having an integrated circuit (IC), such as a micro-electro-mechanical system (MEMS) spatial light modulator (SLM) integrated circuit (IC), such as the wafer level package (WLP) digital micromirror device (DMD) chip 610 (not shown) bonded thereon, between the system printed circuit board (PCB) assembly 1300 and the system interface 1330.

The coil springs 1380 may press the thermal pad 1395 to the thermal interface area 820 of the device 600 with a maximum force of about 25 lbs. The one or more leaf springs 1390 may be useful in retaining the device 600 in the socket assembly 1320 with a maximum force of about 25 lbs.

In various illustrative embodiments, as shown in FIG. 13, the device 600 may be disposed between the system printed circuit board (PCB) assembly 1300, and the system interface 1330, having the plurality of alignment and/or keying features 1340 disposed thereon that interact cooperatively with the plurality of alignment features 740, 750, and 760, and/or the at least one keying feature 750 and/or 760 disposed on the top surface 730 of the monolithic frame 900 to facilitate a "drop-in-place" method of alignment and fixture between the device 600 and the end product system (not shown). In various alternative illustrative embodiments, the monolithic frame 900 may also support the inclusion of features (not shown), such as solder tabs, glue tabs, threaded screw holes, and the like, which facilitate a "fly-in-place" (or adjustable) method of alignment and fixture between the device 600 and the end product system (not shown). In various alternative illustrative embodiments, the monolithic frame 900 may also support the inclusion of alignment and/or attachment features (not shown) for an optical system aperture and/or gasket.

The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present invention. In particular, every range of values (of the form, "from about a to about b," or, equivalently, "from approximately a to b," or, equivalently, "from approximately a-b") disclosed herein is to be understood as referring to the power set (the set of all subsets) of the respective range of values, in the sense of Georg Cantor. Accordingly, the protection sought herein is as set forth in the claims below.

Although various illustrative embodiments of the present invention and their advantages are described in detail, a person skilled in the art having the benefit of the present disclosure could make various alterations, additions, and/or omissions without departing from the spirit and scope of the present invention, as defined by the appended claims.

What is claimed is:

1. A device for an integrated circuit, the device comprising:
    a monolithic frame comprising at least one of plated or unplated powdered metal Kovar, alloy-42, aluminum silicon carbide, and ceramic, having a coefficient of thermal expansion substantially matched to the integrated circuit (IC) mounted to the monolithic frame, the monolithic frame having a plurality of alignment features, comprising at least one opto-mechanical alignment feature and at least one keying feature, disposed thereon, the monolithic frame having a mounting surface disposed thereon for the integrated circuit, the monolithic frame also having a thermal interface area disposed thereon for the integrated circuit;
    an electrical interface capable of providing an electrical connection for the integrated circuit, the plurality of alignment features being substantially independent of the electrical interface; and
    an adhesive layer disposed between the monolithic frame and the electrical interface.

2. The device of claim 1, wherein the electrical interface comprises a printed circuit board and a pin field sub-assembly, with the printed circuit board disposed between the adhesive layer and the pin field sub-assembly.

3. The device of claim 2, wherein the pin field sub-assembly comprises a plurality of electrical connection pins that are capable of mating with a corresponding plurality of system socket pins.

4. The device of claim 2, wherein the pin field sub-assembly comprises a plurality of electrical connection pins that are capable of mating with a corresponding plurality of system socket pins, and pin-guard features providing increased mechanical protection to the plurality of electrical connection pins.

5. The device of claim 2, wherein the pin field sub-assembly comprises a plurality of electrical connection pins that are capable of mating with a corresponding plurality of system socket pins, and at least one orientation keying feature, wherein the at least one orientation keying feature is capable of indicating and dictating a proper rotation orientation between the electrical interface and a corresponding mating system electrical socket.

6. The device of claim 2, wherein the pin field sub-assembly comprises a plurality of electrical connection pins that are capable of mating with a corresponding plurality of system socket pins, and at least one alignment feature, wherein the at least one alignment feature is capable of aligning each of the plurality of electrical connection pins with each of the corresponding plurality of system socket pins to decrease mechanical damage to the plurality of electrical connection pins during insertion into the corresponding plurality of system socket pins.

7. The device of claim 1, wherein the electrical interface comprises a printed circuit board and a mechanical compression interface, with the printed circuit board disposed between the adhesive layer and the mechanical compression interface.

8. The device of claim 7, wherein the mechanical compression interface comprises at least one orientation keying feature, wherein the at least one orientation keying feature is capable of indicating and dictating a proper rotation orientation between the electrical interface and a corresponding mating system printed circuit board.

9. The device of claim 7, wherein the mechanical compression interface comprises at least one alignment feature, wherein the at least one alignment feature is capable of aligning the electrical interface and a corresponding mating system printed circuit board to decrease mechanical damage to the electrical interface during compression of the mechanical compression interface.

10. The device of claim 1, wherein the electrical interface comprises a system printed circuit board, with the adhesive layer disposed between the monolithic frame and the system printed circuit board.

11. The device of claim 1, wherein the electrical interface comprises a flexible printed circuit board, with the adhesive layer disposed between the monolithic frame and the flexible printed circuit board.

12. The device of claim 1, wherein the monolithic frame is capable of providing front-side cooling.

13. The device of claim 1, wherein the adhesive layer comprises at least one of a conductive adhesive and a non-conductive adhesive, the adhesive layer having an optimized thickness, an optimized modulus, and an optimized coefficient of thermal expansion between the monolithic frame and the electrical interface.

14. The device of claim 1, wherein the adhesive layer comprises a conductive adhesive, the adhesive layer having an optimized thickness, an optimized modulus, and an optimized coefficient of thermal expansion between the monolithic frame and the electrical interface, the conductive adhesive forming an electrical connection between the monolithic frame and a ground of the electrical interface.

15. The device of claim 1, wherein the adhesive layer comprises at least one of a conductive high-viscosity adhesive gap filler and a non-conductive high-viscosity adhesive gap filler between the monolithic frame and the electrical interface.

16. The device of claim 1, wherein the adhesive layer comprises a conductive high-viscosity adhesive gap filler and a non-conductive high-viscosity adhesive gap filler between the monolithic frame and the electrical interface, the conductive high-viscosity adhesive gap filler forming an electrical connection between the monolithic frame and a ground of the electrical interface.

17. The device of claim 1, wherein the adhesive layer comprises a non-conductive adhesive having an optimized thickness, an optimized modulus, and an optimized coefficient of thermal expansion between the monolithic frame and the electrical interface, and a conductive high-viscosity adhesive gap filler between the monolithic frame and the electrical interface, the conductive high-viscosity adhesive gap filler forming an electrical connection between the monolithic frame and a ground of the electrical interface.

18. The device of claim 1, wherein the adhesive layer comprises a conductive adhesive having an optimized thickness, an optimized modulus, and an optimized coefficient of thermal expansion between the monolithic frame and the electrical interface, and a non-conductive high-viscosity adhesive gap filler between the monolithic frame and the electrical interface, the conductive adhesive forming an electrical connection between the monolithic frame and a ground of the electrical interface.

19. The device of claim 1, wherein the adhesive layer comprises a first portion of conductive adhesive and a second portion of non-conductive adhesive having an optimized thickness, an optimized modulus, and an optimized coefficient of thermal expansion between the monolithic frame and the electrical interface, the first portion of conductive adhesive forming an electrical connection between the monolithic frame and a ground of the electrical interface.

20. A device for an integrated circuit, the device comprising:
    a monolithic frame comprising unplated, powdered metal alloy-42, having a coefficient of thermal expansion substantially matched to silicon, the monolithic frame having a plurality of alignment features, comprising at least one opto-mechanical alignment feature and at least one keying feature, disposed thereon, the monolithic frame having a mounting surface disposed thereon for the integrated circuit, the monolithic frame also having a thermal interface area disposed thereon for the integrated circuit;
    an electrical interface capable of providing an electrical connection for the integrated circuit, the plurality of alignment features being substantially independent of the electrical interface, the electrical interface comprising a printed circuit board and a pin field sub-assembly, the printed circuit board disposed between the adhesive layer and the pin field sub-assembly, the pin field sub-assembly comprising a plurality of electrical connection pins and a plurality of features comprising a pin-guard, socket keying features, and socket alignment features; and
    an adhesive layer disposed between the monolithic frame and the electrical interface, the adhesive layer comprising a conductive adhesive portion and a non-conductive adhesive portion, the conductive adhesive portion forming an electrical connection between the monolithic frame and a digital signal ground of the electrical interface, the non-conductive adhesive portion having a thickness substantially optimized to bridge a coefficient of thermal expansion of the monolithic frame and a coefficient of thermal expansion of the printed circuit board of the electrical interface and substantially optimized to bridge a modulus of elasticity of the monolithic frame and a modulus of elasticity of the printed circuit board of the electrical interface.

\* \* \* \* \*